(12) United States Patent
Namm et al.

(10) Patent No.: US 8,451,193 B2
(45) Date of Patent: May 28, 2013

(54) OVERLAYED DISPLAY

(75) Inventors: Joseph C. Namm, Plantation, FL (US); Jorge L. Garcia, Plantation, FL (US); Salvador P. Magana, Wellington, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 536 days.

(21) Appl. No.: 12/550,761

(22) Filed: Aug. 31, 2009

(65) Prior Publication Data

US 2011/0050545 A1    Mar. 3, 2011

(51) Int. Cl.
*G09G 5/00* (2006.01)

(52) U.S. Cl.
USPC .................................... 345/4; 345/5

(58) Field of Classification Search
None
See application file for complete search history.

(56) References Cited

U.S. PATENT DOCUMENTS

| | | | |
|---|---|---|---|
| 6,714,268 B2 | 3/2004 | Wang et al. | |
| 7,250,930 B2 | 7/2007 | Hoffman et al. | |
| 2002/0149576 A1* | 10/2002 | Tanaka et al. | 345/204 |
| 2004/0109106 A1* | 6/2004 | Yang et al. | 349/69 |
| 2005/0007517 A1* | 1/2005 | Anandan | 349/69 |
| 2005/0280766 A1* | 12/2005 | Johnson et al. | 349/167 |
| 2006/0109397 A1* | 5/2006 | Anandan | 349/69 |
| 2006/0114371 A1* | 6/2006 | Peterson et al. | 349/61 |
| 2006/0262242 A1* | 11/2006 | Koma | 349/69 |
| 2007/0018943 A1* | 1/2007 | Bayrle et al. | 345/102 |
| 2007/0057881 A1 | 3/2007 | Yu et al. | |
| 2007/0075935 A1 | 4/2007 | Mesmer et al. | |
| 2007/0242003 A1* | 10/2007 | Vogel et al. | 345/76 |
| 2008/0252556 A1* | 10/2008 | Tseng et al. | 345/6 |
| 2008/0273130 A1* | 11/2008 | Tung et al. | 349/38 |
| 2009/0225243 A1* | 9/2009 | Kim et al. | 349/15 |
| 2009/0256830 A1* | 10/2009 | Klinghult et al. | 345/211 |
| 2009/0315918 A1* | 12/2009 | Minami et al. | 345/690 |
| 2010/0052528 A1* | 3/2010 | Park et al. | 313/506 |
| 2010/0125890 A1* | 5/2010 | Levine et al. | 725/131 |
| 2010/0314995 A1 | 12/2010 | Ikeda et al. | |

FOREIGN PATENT DOCUMENTS

| | | |
|---|---|---|
| JP | 2006162705 A | 6/2006 |
| JP | 2006308897 A | 11/2006 |
| JP | 2007071948 A | 3/2007 |
| JP | 2008218406 A | 9/2008 |

OTHER PUBLICATIONS

Hao, Xiaotao et al—Project—Top-Emitting Organic Light-Emitting Device (TOLED)—2009—3 Pages.
Transparent OLED Displays That Use Light-Emitting Polymers—AZoM News Archive—2000-2009—4 pages.
International Search Report and Written Opinion mailed on Feb. 25, 2011 for International Application No. PCT/US2010/043293.

* cited by examiner

*Primary Examiner* — Joseph Feild
*Assistant Examiner* — Henok Heyi
(74) *Attorney, Agent, or Firm* — Barbara R. Doutre (57) ABSTRACT

A display (202) is formed on an OLED layer (210) and at least one other layer formed of different display technology (212). At least one sensor (206 and/or 208) is used to determine a condition which impacts readability of the display (202). The different display layers are enabled and disabled in response to the sensed conditions to provide optimum viewing.

38 Claims, 10 Drawing Sheets

OVERLAYED DISPLAY

FIELD OF THE DISCLOSURE

The present disclosure relates generally to displays and more particularly to display structures.

BACKGROUND

Electronic devices often include a display to provide a user interface. For example, communication devices, such as portable radios, mobile vehicular radios, cellular phones, personal digital assistants (PDAs), pagers, accessories and the like typically have a display to indicate radio parameters, such as channel, volume, battery life, incoming and outgoing messages, etc. Displays incorporated into communication devices may be used in a variety of environments and conditions. Depending on the environment and conditions within which the communication device is being used, the display may be more difficult to read at some times than others. When operating in fireground applications for example, lighting, smoke and temperature variables may all have an impact on the display of a portable radio. While some displays have good daytime readability, the ability to read the display at night or without ambient light can be difficult. While some displays can be backlit, the readability may still not be optimum due to the difficulty in achieving even illumination in conjunction with good contrast.

Accordingly, it would be highly desirable to have an improved display to overcome the aforementioned problems.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Before describing in detail embodiments that are in accordance with the present invention, it should be observed that the embodiments reside primarily in combinations of method, steps and components related to layering a plurality of display technologies such that the optimum display is turned on based on sensing conditions, such a lighting and/or temperature conditions. The resulting display provides improved readability under varying conditions along with an improvement in overall display life.

In the description herein, numerous specific examples are given to provide a thorough understanding of various embodiments of the invention. The examples are included for illustrative purpose only and are not intended to be exhaustive or to limit the invention in any way. It should be noted that various equivalent modifications are possible within the spirit and scope of the present invention. One skilled in the relevant art will recognize, however, that an embodiment of the invention can be practiced with or without the apparatuses, systems, assemblies, methods, components mentioned in the description.

The multi-layered display technologies utilized in accordance with the various embodiments to be described herein include organic light emitting diode (OLED) technology, LCD technology, and electrophoretic technology. Other display technologies, known or yet to be developed, may also be used based on the ability to view and control the displays under varying environmental conditions. The display images provided by the various technologies may be pixelated, segmented, combinations thereof or encompass other display formats known or yet to be developed. A brief description of various display technologies is provided.

An OLED, also referred to as light emitting polymer (LEP) and organic electro luminescence (OEL), is a light emitting diode (LED) having an emissive electroluminescent layer composed of a film of organic compounds. The layer usually contains a polymer substance that allows suitable organic compounds to be deposited. The compounds are deposited in rows and columns onto a flat carrier by a "printing" process. The resulting matrix of pixels can emit light of different colors. Standard OLEDs and transparent OLEDs (TOLEDs) provide similar brightness and optical performance characteristics. As will be described herein in accordance with various embodiments, the transparency characteristic of the TOLED display allows it to be placed in front of other display technologies.

LCDs are formed by stacking layers or portions of layers of materials including glass, plastic, metals, and organic films. LCDs provide both a reflective layer and a clear layer which in combination with other layers permit an image to be seen on one side of the display stack. LCD displays are commonly backlit using internal lights, such as light emitting diodes (LEDs). A light guide or light pipe can be used to couple light to illuminate the LCDs.

Each of the OLED display and LCD technologies has its own characteristics, advantages and disadvantages. A significant benefit of OLED displays over traditional LCDs is that OLEDs do not require a backlight to function. Thus, OLED displays draw far less power and, when powered from a battery, can operate longer on the same charge. Because there is no need for a backlight, an OLED display can be much thinner than an LCD panel. OLED displays provide very good contrast as compared to LCD displays, particularly at low ambient light. However, OLEDs have poor daytime readability while transflective LCDs far better daytime readability. Additionally, OLED displays have poor display life making it impractical to continuously light the display. LCD displays, on the other hand, have significantly better display life. As to performance under temperature, OLEDs have better performance at cold temperatures when compared to LCDs, because OLEDs emit light directly from the application of electric current whereas time lags occur in activating any twisted-nematic (cross polarizing) LCD at very cold temperatures A twisted nematic (TN) display is a liquid-crystal display (LCD) that consists of a substance called a nematic liquid crystal that is confined between two plates of polarized glass. The TN display takes advantage of the ability of the nematic substance to rotate the polarization of light beams passing through it. Two polarizing filters, parallel planes of glass with their polarizing lines oriented at right angles with respect to each other, are positioned on either side of the liquid crystal. With the application of a voltage, an electric field is produced in the nematic liquid crystal. Under these conditions the polarization effect is reduced. If the voltage is large enough, the polarization effect disappears altogether, and the light is blocked by an output polarizing filter.

Thin film transistor (TFT) LCDs are constructed similarly to TN LCDs in terms of components and layering scheme (i.e. glass, polarizer, backlighting, etc) but with the addition of such things as thin film transistors, color filters, conductive layers, etc. which makes the manufacturing process of TFT LCDs significantly more complex. TFT LCD displays use liquid crystal in which each pixel is individually driven by a transistor switch. As such, faster liquid crystals are able to be used than those on passive matrix TN displays. TFT LCDs have similar viewing angle limitations to TN LCDs. TFT LCDs are formed of active matrix architectures driving each pixel which allows for much larger and finer resolution along with improved contrast and response times at all temperatures over TN LCDs.

When compared to OLEDs OLED type displays offer constant contrast ratios at all viewing angles while TN or TFT type displays vary significantly across viewing angles and are generally peak at viewing angles normal to the surface of the display. Some OLED colors are also achieve over 100,000 hours of life, which is considered a general guideline for the life of side-firing LEDs used in many TN or TFT type backlit displays.

Another display technology comprises electrophoretic display. Like the LCD, the electrophoretic display uses a suspension of particles that are aligned when activated. Electrophoretic displays provide the best daytime visibility, while OLEDs have the best nighttime visibility. OLEDs have superior performance at cold temperatures over electrophoretic displays.

These previous descriptions of various display technologies have been described to facilitate the understanding of the various embodiments of the invention which follow. In accordance with the various embodiments, display technologies are combined by overlaying displays for optimum viewability over variable environmental conditions.

Figure 1:
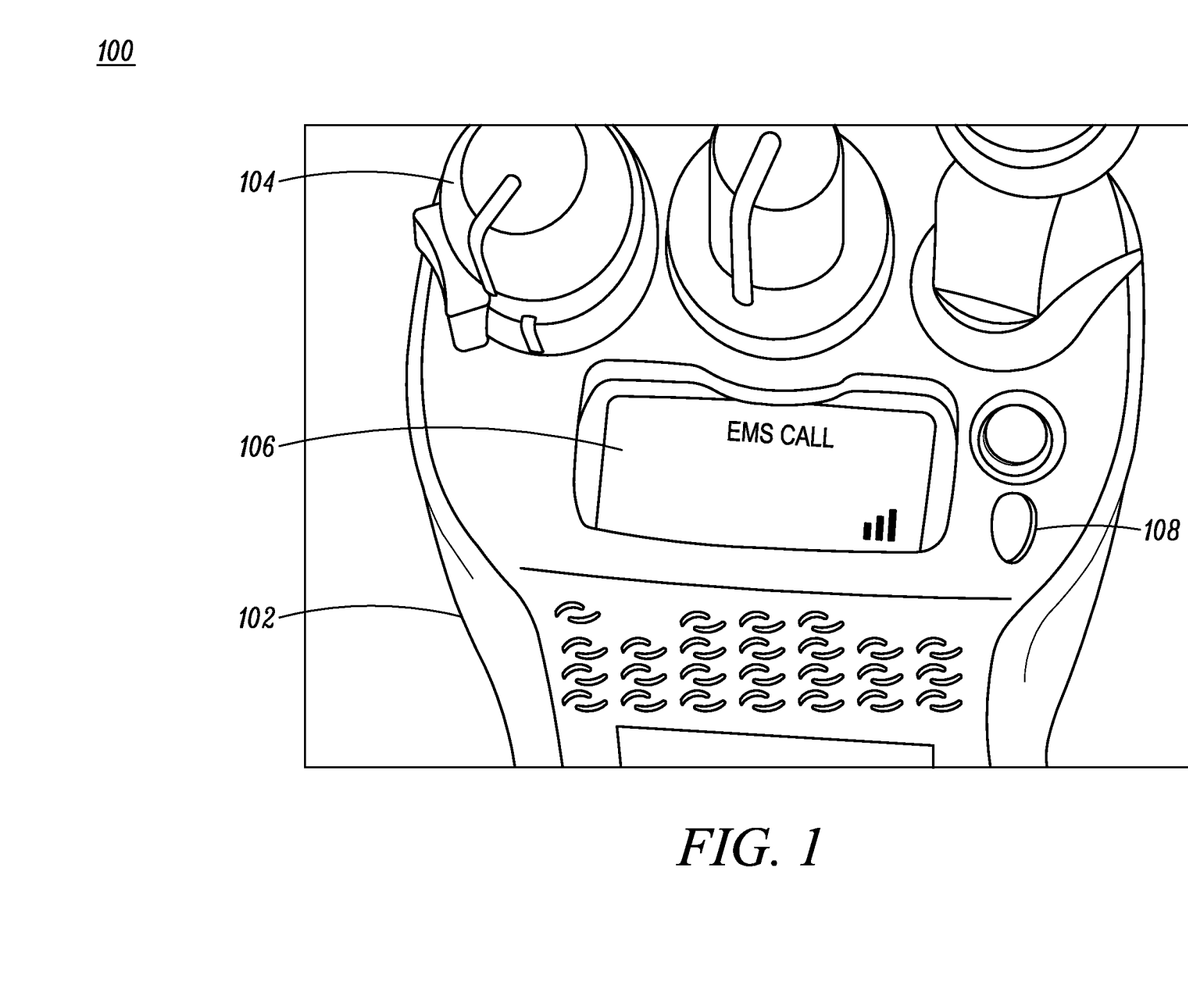
FIG. 1 is communication device incorporating a display formed in accordance with some embodiments.

FIG. 1 is communication device, shown here as a portable radio, incorporating a display formed in accordance with some embodiments. Portable radio 100 is formed of a housing 102 having a user interface including knobs 104 and a display 106 formed in accordance with various embodiments of the invention. In accordance with the various embodiments, display 106 comprises an overlay of an OLED layer and a display of another technology, such as LCD or electrophoretic. In accordance with the various embodiments, the OLED layer and secondary display layer are each selectively turned on/off based on ambient light and/or temperature conditions. Lighting and temperature conditions are sensed by sensors coupled to or within the housing 102. A light sensor 108 is shown located on the housing 102 but may be integrated into the display area as well or other suitable location. The temperature sensor may be located internally or externally to the housing 102, but is preferably located close to the display area, for example on a display flex.

As an example, display 106 may comprise a TOLED display layered over an LCD. The LCD is characterized by transflective, transmissive or reflective lighting qualities. The product level requirements and battery life constraints determine whether a TN or TFT display has transmissive, transflective, or reflective properties. A reflective display relies solely on ambient light (or a front mounted light source) for readability, while a transmissive display relies solely on a back mounted light source (i.e. lightguide). A transflective display embodies transmissive and reflective properties.

Figure 2:
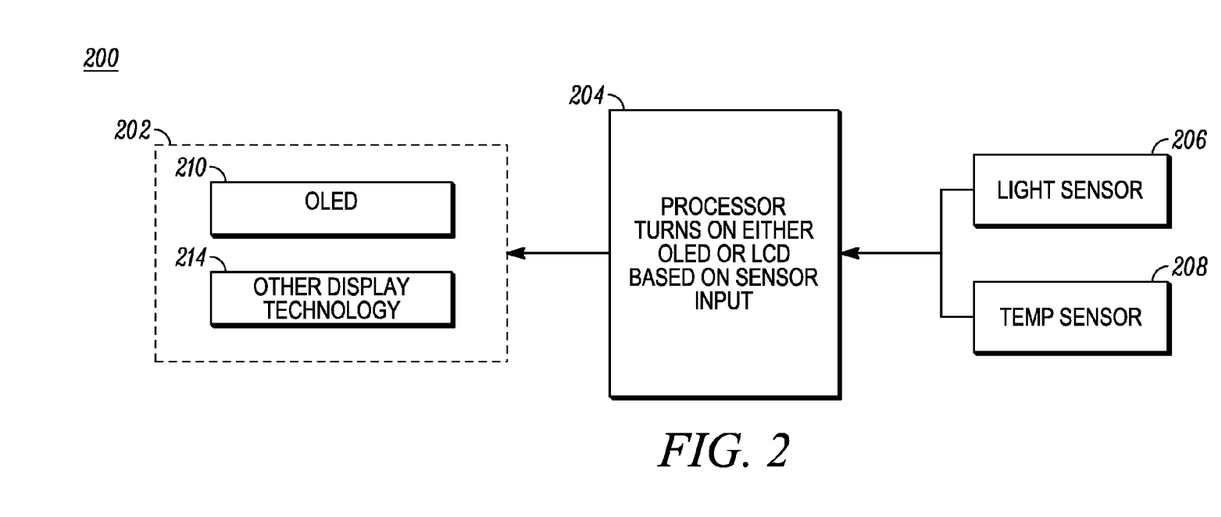
FIG. 2 is a block diagram for operating the display in accordance with an embodiment.

Referring to FIG. 2, there is shown a block diagram 200 of the apparatus used in operating display 106 in accordance with an embodiment. Display 106 is formed of an OLED 210 layered upon secondary display technology layer 212. A processor 204 selectively turns the OLED 210 or secondary display technology layer 212 on or off based on input received from a light sensor 206 and a temperature sensor 208.

Figure 3:
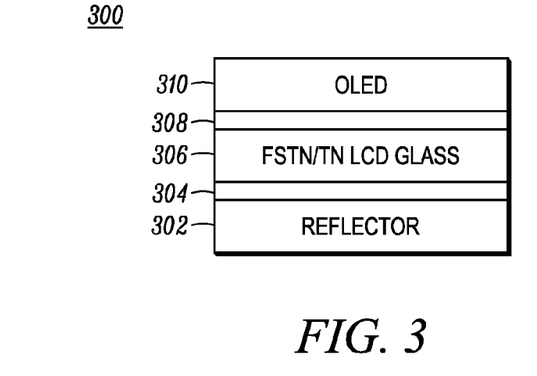
FIG. 3 the display formed in accordance with another embodiment.

FIG. 3 shows an embodiment of a display 300 formed in accordance with another embodiment. Display 300 comprises a plurality of layers including a reflector 302, a first polarizer layer 304, an FSTN/TN LCD glass 306, a second polarizer 308, and OLED 310. When placed in an electronic device, the stack-up of display 300 (and those to follow in subsequent figures) is configured such that the top layer (in this case OLED layer 310) provides the outer layer on the device. Locating the OLED 310 on the outside provides for the highest amount of light output. A transparent OLED (TOLED) is preferably used in configurations seeking to achieve maximum brightness. By locating the OLED 310 farther from the reflector 302, some "shadowing effects" will be incurred from the light of the OLED reflecting off the reflector.

Figure 4A:
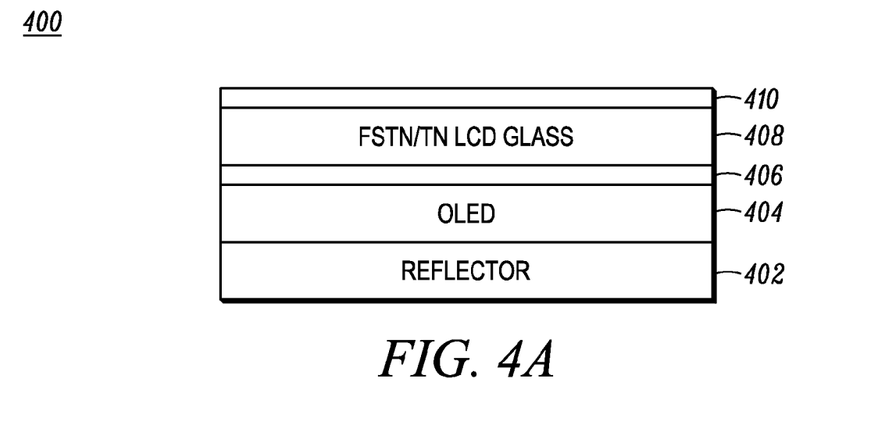
FIGS. 4A and 4B show two alternative embodiments of the display.
Figure 4B:
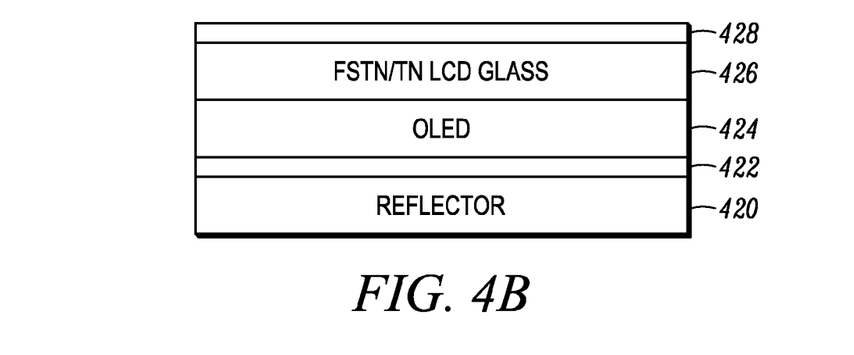

FIGS. 4A and 4B show another two embodiments of a display 400 formed in accordance with various embodiments of the invention. Configuration 4A comprises a reflector layer 402 coupled to OLED 404. The OLED 404 is coupled to a first reflector polarizer layer 406. The first polarizer layer 406 is coupled to an TN/FSTN LCD 408. A second polarizer layer 410 tops off the TN/FSTN LCD 408. In the stack-up of FIG. 4A, the OLED 404 is located as close to the reflector layer 402 as possible. This layering stack-up does not require the use of a transparent OLED, as the reflector could be the OLED itself. While configuration 4A minimizes shadowing, the brightness of the OLED output may be somewhat diminished by the two polarizers 406, 410 and LCD 408. For applications in which diminished brightness needs to be avoided, it may be preferable to place a transparent OLED directly behind the TN type display as seen in FIG. 4B.

FIG. 4B shows a display configuration formed in accordance with an alternative embodiment in which a first polarizer layer 422 is placed between the reflector and the OLED. In this configuration, the layers stack with reflector 420 being layered with first polarizer layer 422. First polarizer layer 422 is layered with OLED 424. OLED 424 is layered with TN/FSTN LCD 426. And, the TN/FSTN LCD 426 is layered with a second polarizer layer 428. The configuration shown in FIG. 4B provides improved light output of the OLED 424 by locating one of the polarizers 422 behind the OLED. The OLED 422 is still close to the reflector 420 to minimize shadowing. Again, either transparent or non-transparent OLEDs may be used in the configurations of FIGS. 4A and 4B.

Figure 5:
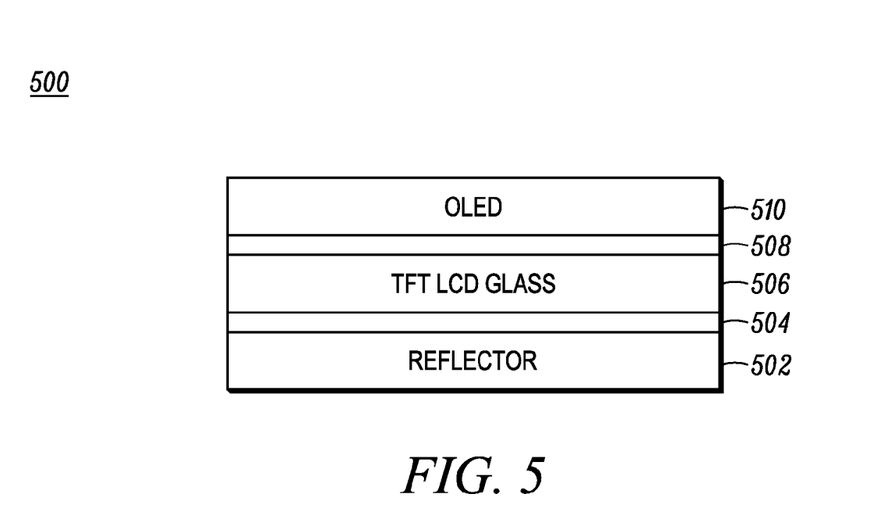
FIG. 5 shows another embodiment of the display.

FIG. 5 shows an alternative LCD technology being used in a display 500 formed in accordance with another embodiment. Display 500 is formed of a reflector 502 layered with a first polarizer layer 504, a thin film transistor (TFT) LCD 506, a second polarizer layer 508 and an OLED 510. The embodiments of FIGS. 3 and 5 are the similar except for the use of the TFT LCD 506 in FIG. 5. Here again, as in FIG. 3, the placement of the OLED 510 on the outside of the stack-up provides for the highest amount of light output. The use of the TFT LCD 506 provides larger and finer resolution along with improved contrast and response times at all temperatures over the TN LCD 306 of FIG. 3. Like the display 300 of FIG. 3 some shadowing effects will be incurred in display 500 from the light of the OLED 510 reflecting off the reflector 502, but these are a tradeoff for the improved brightness.

Figure 6:
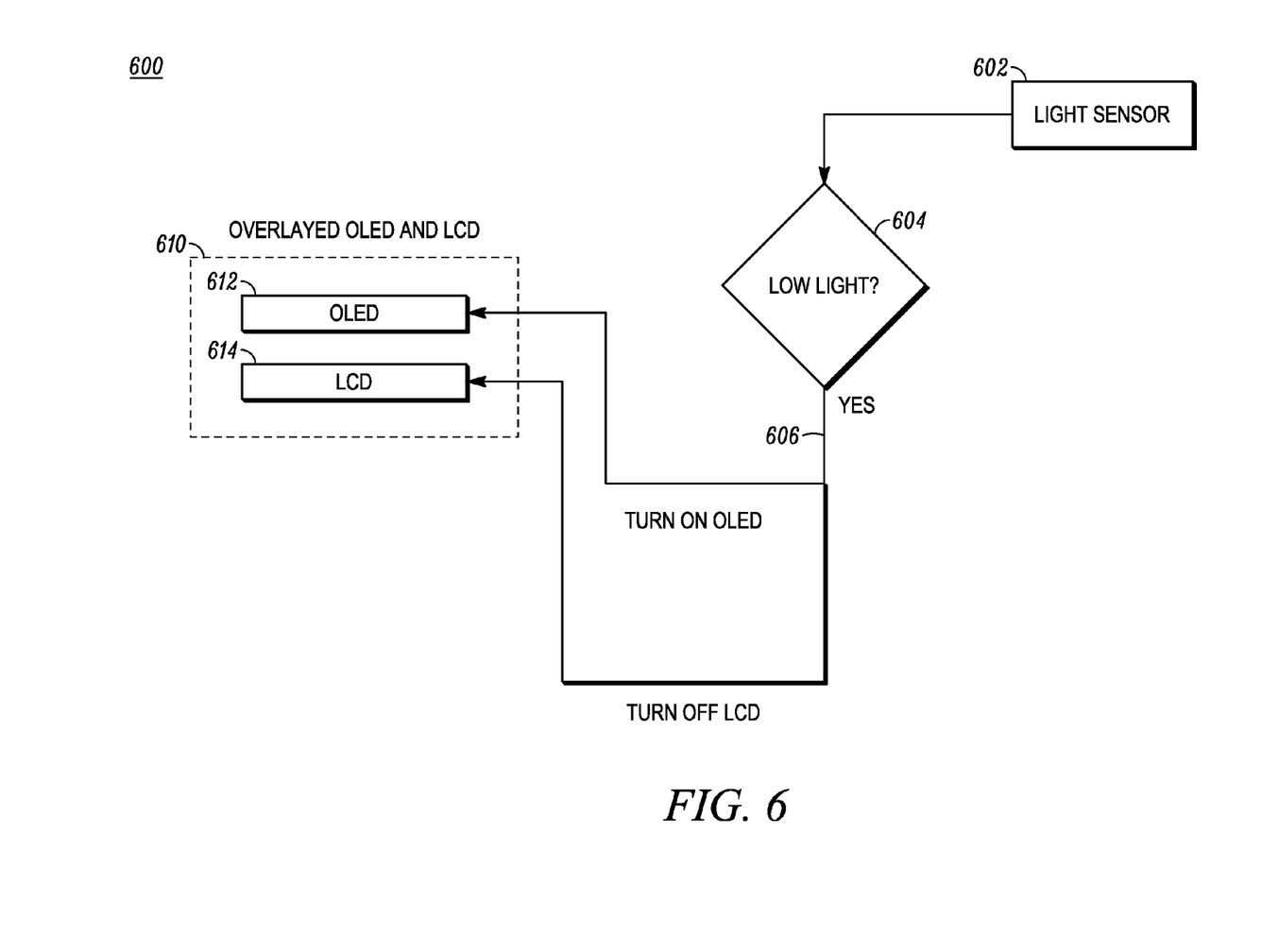
FIGS. 6 and 7 are flow diagrams for operating the display formed in accordance with various embodiments under varying temperature conditions.
Figure 7:
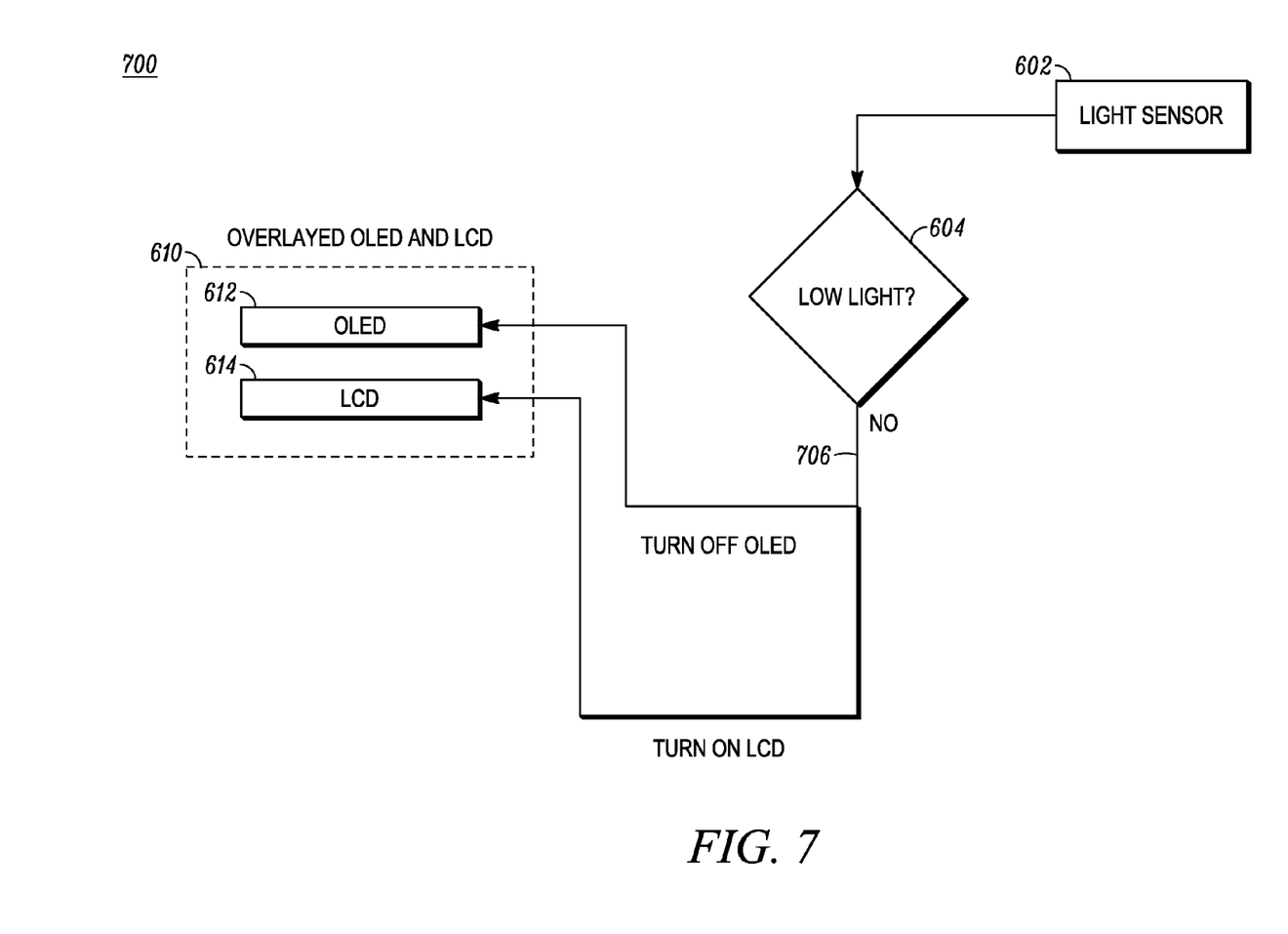

FIG. 6 shows a flow diagram 600 of a display 610 having an overlayed OLED 612 and LCD 614. Light is sensed by a light sensor 602. If the level of light is determined to be low (beneath a predetermined light threshold as determined by a processor), then the OLED 612 turns on and the LCD 614 turns off in response to control signals 606 received from the processor. FIG. 7 shows a flow diagram 700 in which light sensed by the light sensor 602 is determined to be above the predetermined light threshold. As such, the OLED 612 turns off and the LCD 614 turns on in response to control signals 706 received from the processor.

Figure 8:
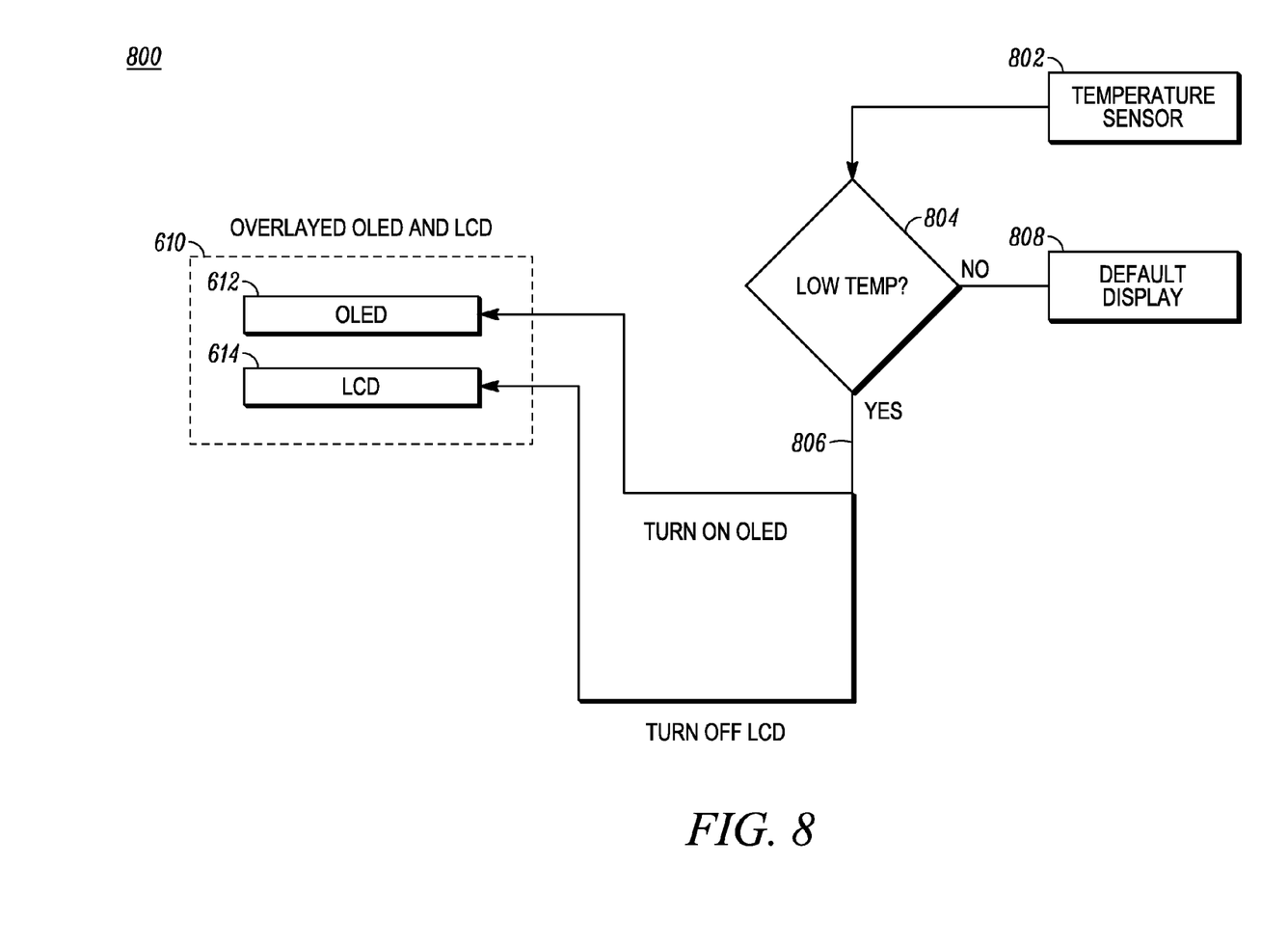
FIG. 8 shows another flow diagram for operating the display formed in accordance with various embodiments under varying light conditions.

FIG. 8 shows a flow diagram 800 of the display 610 having overlayed OLED 612 and LCD 614. Temperature is sensed by a temperature sensor 802. If the temperature is determined to be low (beneath a predetermined low temperature threshold as determined by a processor), then the OLED 612 turns on and the LCD 614 turns off in response to control signals 806 received from the processor. When the temperature sensed by the temperature sensor 802 is determined not to be below the predetermined low temperature threshold at 804, then either one of the OLED display or the LCD display is turned on as a default display 808. The default display may be either pre-programmed or selected by a user. Alternatively, when the temperature sensed by the temperature sensor 802 is determined not to be below the predetermined low temperature threshold, the default mode can encompass having both displays (OLED and LCD) turned on at the same time to create a 3-D type shadowing effect.

Accordingly, combining the plurality of display technologies in the form of an OLED display and an LCD display into a single overlayed display provides improved viewing under varying conditions.

Figure 9:
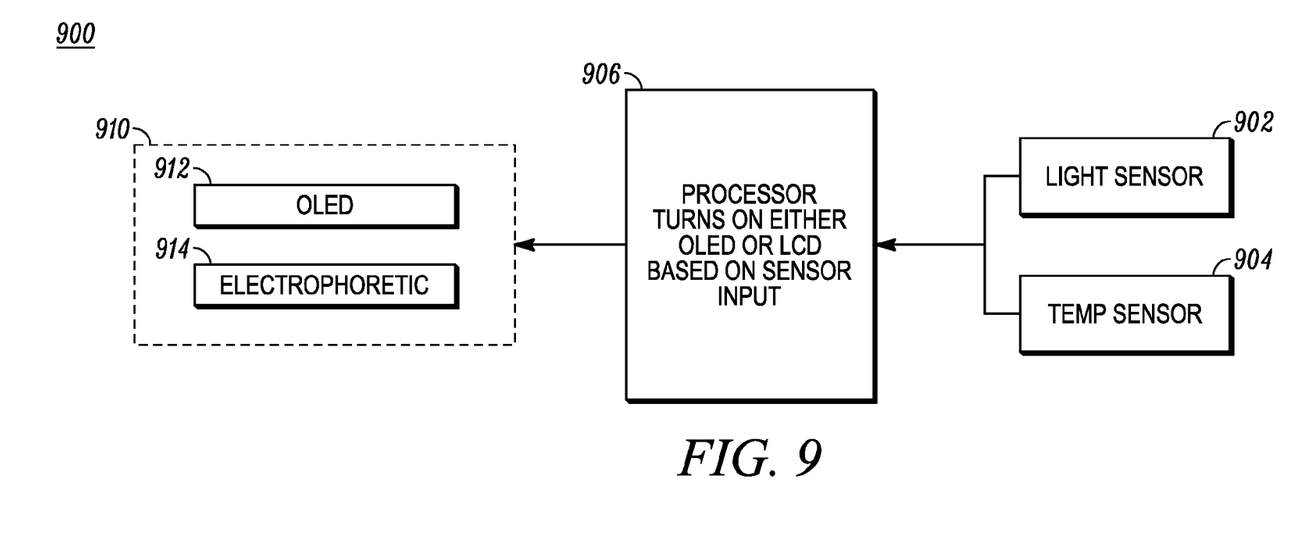
FIG. 9 is a block diagram for operating a display formed in accordance with another embodiment.

FIG. 9 is a block diagram 900 showing a display 900 laving a plurality of layers of different display technologies. In this embodiment, display 910 includes OLED 912 and an electrophoretic display, such as an E-Ink display, 914. Electrophoretic displays are formed of micro-spheres, each containing an abundance of both black (negative) and white (positive) microscopic particles suspended in a transparent fluid, that allow the free floating particles to swirl to a polar orientation when an external voltage is applied. In this embodiment, light sensor 902 senses light conditions and temperature sensor 904 sense temperature conditions to provide inputs to processor 906. Processor 906 controls selectively enabling and disabling the OLED 912 and electrophoretic display 914 in response to the sensor inputs.

Figure 10:
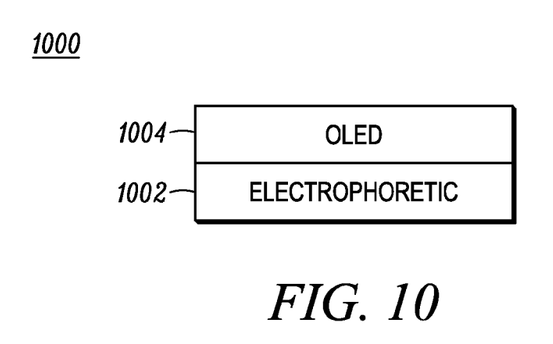
FIG. 10 shows a display structure in accordance with an embodiment.
Figure 11:
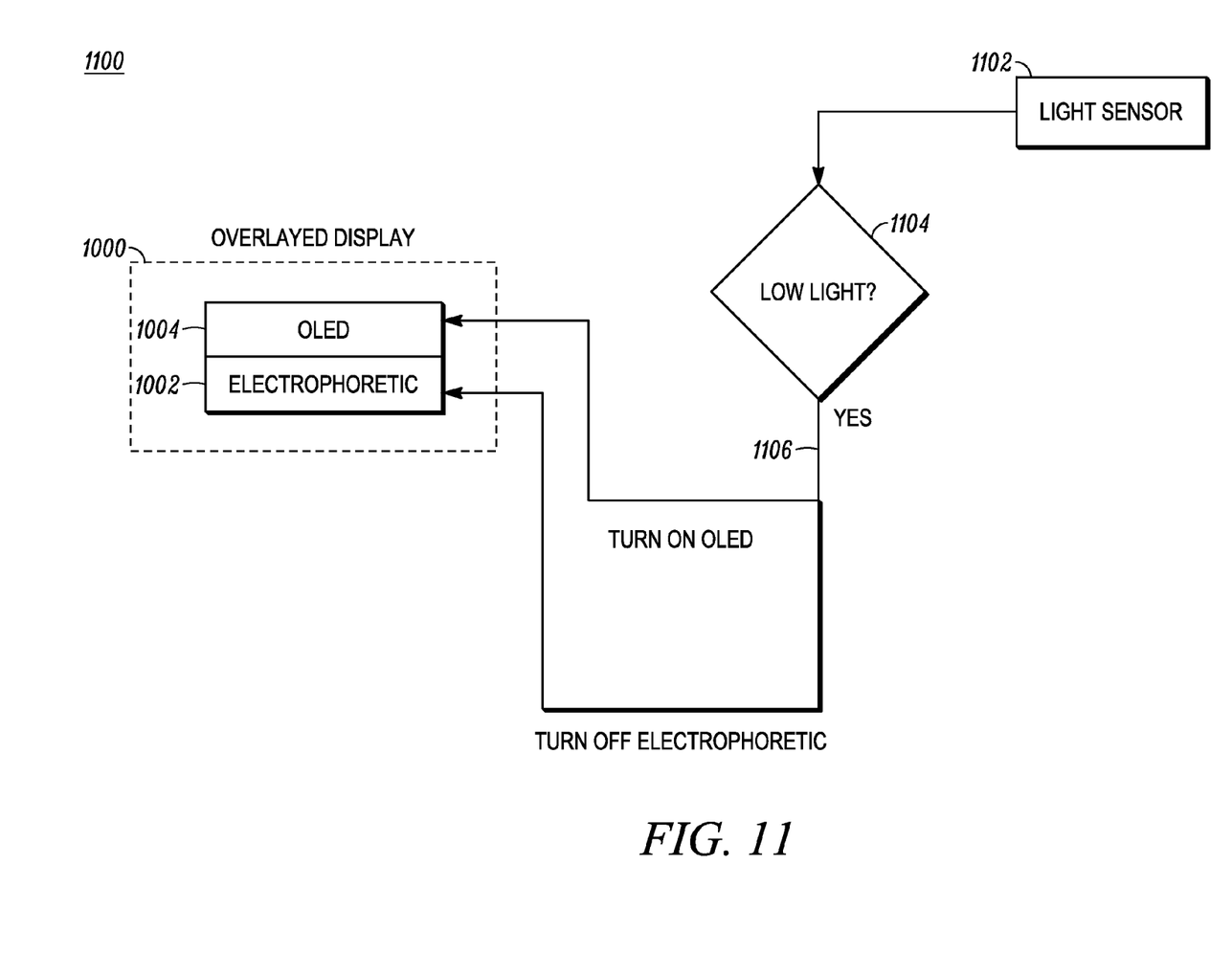
FIGS. 11 and 12 are flow diagrams for operating the display of FIG. 10 under varying light conditions.
Figure 12:
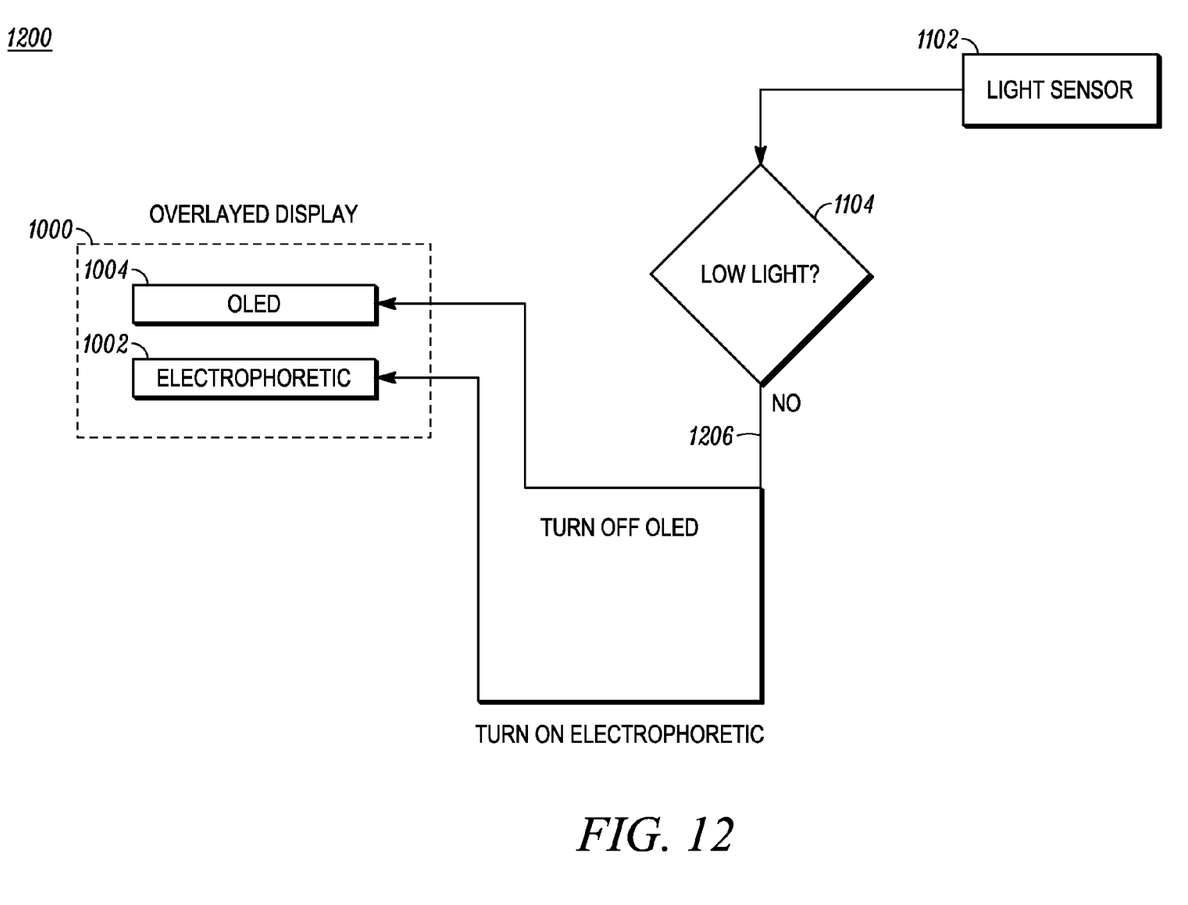

FIG. 10 shows a display structure 1000 in which an electrophoretic layer 1002 is overlayed with an OLED 1004 layer in accordance with another embodiment. In FIG. 11 a flow diagram 1100 shows the operation of the display 1000. Light is sensed by a light sensor 1102. If the level of light is determined to be low at 1104 (beneath a predetermined light threshold as determined by a processor), then the OLED 1004 turns on and the electrophoretic display 1002 turns off in response to control signals 1106 received from the processor. FIG. 12 shows a flow diagram 1200 in which light sensed by the light sensor 1102 is determined to be above the predetermined light threshold. As such, the OLED 1004 turns off and the electrophoretic display 1002 turns on in response to control signals 1206 received from the processor.

Figure 13:
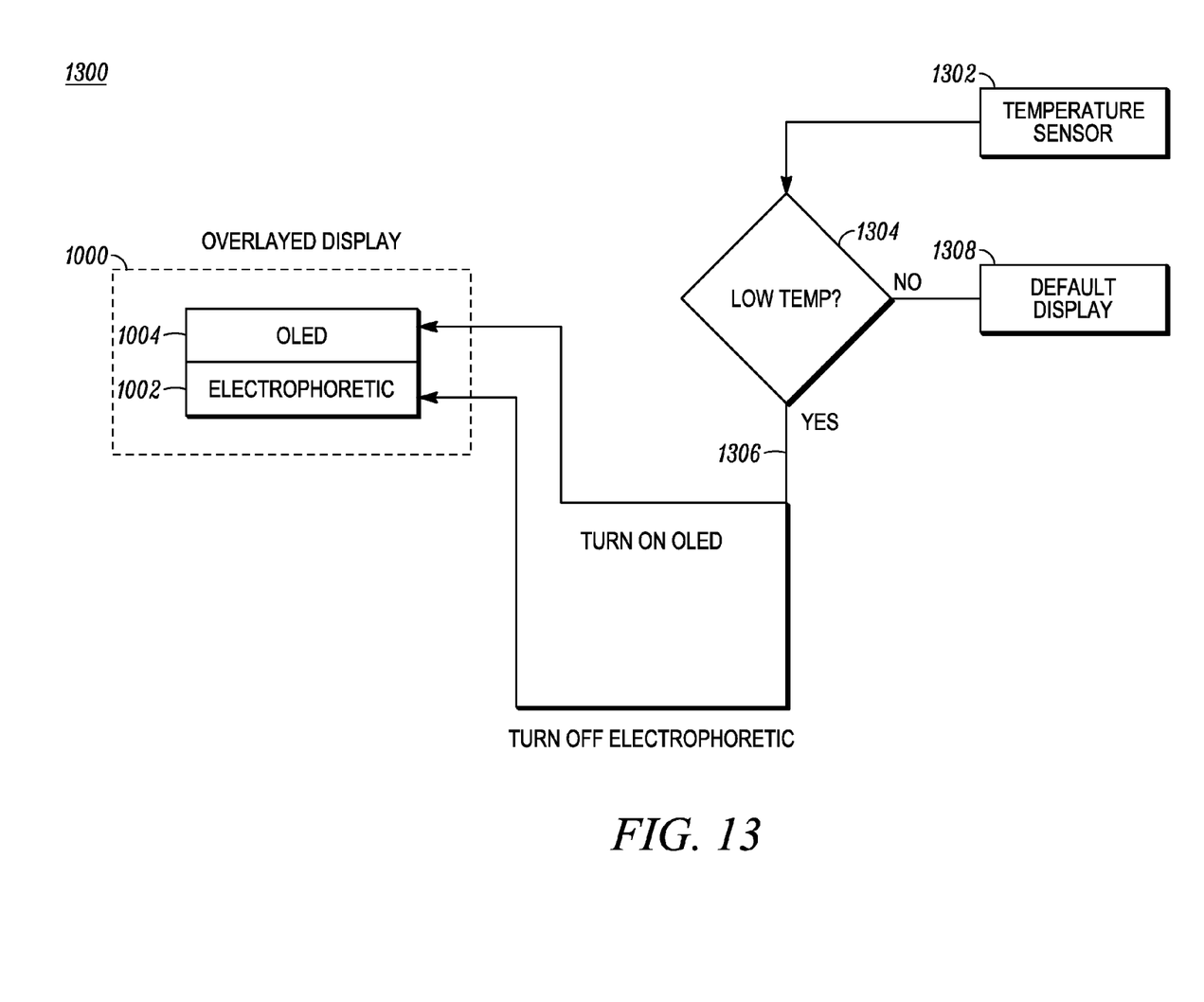
FIG. 13 shows a flow diagram for the display of FIG. 10 under varying temperature conditions.

FIG. 13 shows a flow diagram 1300 for the display 1000 having overlayed OLED 1004 and electrophoretic display 1002. Temperature is sensed by a temperature sensor 1302. If the temperature is determined to be low (beneath a predetermined low temperature threshold as determined by a processor) 1304, then the OLED 1004 turns on and the electrophoretic display 1002 turns off in response to control signals 1306 received from the processor. When the temperature sensed by the temperature sensor 1302 is determined not to be below the predetermined low temperature threshold at 1304, then either one of the OLED display or the electrophoretic display can be turned on as a default display 1308. The default display may be either pre-programmed or selected by a user. Alternatively, the default display can encompass turning on both the OLED display and electrophoretic display to create a 3-D shadowing effect when the temperature is not below the predetermined low temperature threshold at 1304.

Accordingly, combining two display technologies in the form of an OLED display and electrophoretic display into a single overlayed display provides that provides improved viewing under varying conditions.

Combining display technologies into an overlayed display provides the benefit of improved viewing over varying conditions. A variety of parameter combinations can be considered for optimum viewing of the overall display. The following Table is provided as an example of various combinations that can be used with a display formed and operating in conjunction with the various embodiments.

| Temperature | Ambient Light | OLED | Electrophoretic Display | LCD |
| --- | --- | --- | --- | --- |
| Cold | low | ON | | OFF |
| Cold | Low | ON | OFF | |
| Hot | low | ON | | OFF |
| Hot | high | OFF | ON | |
| Medium | medium | default | default | default |

The default condition is one which is user selectable or pre-programmed.

The selection of display technologies is based on the environmental conditions within which a product having the display will be used. The positioning of the layers is based on balancing the need for brightness versus shadowing. For optimal brightness the TOLED can be placed ahead of the secondary display technology. Shadowing may be minimized by the placement of reflectors. Standard OLEDs can be used when the OLED is being placed behind the secondary technology. By overlaying an OLED display with a display of a different technology, a single display is provided to a viewer. Overall display readability is optimized by sensing environmental parameters to enable and disable the display layers across varying conditions while also improving display life. The OLED display life is improved by not having the OLED on all the time. For example, the overall display life is doubled in applications where the OLED is only used fifty percent of the time, and the LCD is used the other fifty percent. A display formed in accordance with the various embodiments can be used in portable radios, mobile vehicular radios, cellular phones, personal digital assistants (PDAs), pagers, accessories and the like to provide an improved user interface. The display is particularly well suited to fireground applications where variations in light and temperature play an integral role in the use of a product.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized controllers (or "controlling devices") such as microcontroller, customized controllers and unique stored program instructions (including both software and firmware) that control the one or more controllers to implement, in conjunction with certain non-controller circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject Those skilled in the art will appreciate that the above recognized advantages and other advantages described herein are merely exemplary and are not meant to be a complete rendering of all of the advantages of the various embodiments of the present invention.

We claim:

1. A display, comprising:
   a first display layer formed of an organic light emitting diode (OLED) display; and
   a second display layer disposed under to the first display layer, the second display layer being formed of a second display technology, wherein the first display layer and the second display layer are selectively turned on and off in response to inputs received from at least one temperature sensor.

2. The display of claim 1, wherein the first and second display layers are automatically enabled and disabled in response to predetermined conditions which impact the viewing of the display.

3. The display of claim 2, wherein the predetermined conditions comprise predetermined temperature and light conditions.

4. The display of claim 1, wherein the second display technology comprises liquid technology display (LCD) technology thereby providing an OLED layer and an LCD layer.

5. The display of claim 4, wherein the LCD technology comprises a twisted-nematic (TN) technology or a fast twisted-nematic (FSTN) type of technology.

6. The display of claim 5, further comprising:
   a reflector layer;
   a first polarizer layer coupled between the reflector layer and the LCD layer; and
   a second polarizer layer coupled between the LCD layer and the OLED layer.

7. The display of claim 5, further comprising:
   a reflector layer coupled to the OLED layer;
   a polarizer layer coupled between the OLED layer and the LCD layer; and
   a second polarizer layer coupled to the LCD layer.

8. The display of claim 5, further comprising:
   a reflector layer;
   a first polarizer layer coupled between the reflector layer and the OLED layer;
   the LCD layer being coupled to the OLED layer; and
   a second polarizer layer coupled to the LCD layer.

9. The display of claim 5, further comprising:
   a reflector layer;
   a first polarizer layer coupled between the reflector layer and the OLED layer;
   the LCD layer being coupled to the OLED layer; and
   a second polarizer layer coupled to the LCD layer.

10. The display of claim 4, wherein the LCD layer is formed of a thin film transistor (TFT) technology.

11. The display of claim 10, further comprising:
    a reflector;
    a first polarizer layer coupled to the reflector, and the LCD layer being coupled to the first polarizer layer; and
    a second polarizer layer coupled between the LCD layer and the OLED layer.

12. The display of claim 1, wherein the second technology comprises electrophoretic display technology.

13. The display of claim 12, wherein the first and second display layers formed of OLED technology and electrophoretic technology are automatically enabled and disabled in response to predetermined conditions which impact the viewing of the display.

14. An electronic device, comprising:
a housing;
a display coupled to the housing, the display formed of a layered organic light emitting diode (OLED) display and a second display layered with the OLED;
a processor operatively coupled to the display; and
at least one sensor coupled to the processor, the processor selectively turning the OLED display and the second display on and off in response to inputs received from the at least one sensor, wherein the at least one sensor comprises a temperature sensor.

15. The electronic device of claim 14, wherein the at least one sensor comprises a light sensor.

16. The electronic device of claim 14, wherein the at least one sensor senses light and temperature.

17. The electronic device of claim 14, wherein the second display comprises a liquid crystal display (LCD).

18. The electronic device of claim 17, wherein the OLED turns on and the LCD turns off in response to light sensed by the at least one sensor being below a predetermined light threshold, and the OLED turns off and the LCD turns on in response to the light sensed by the at least one sensor being above or at the predetermined light threshold.

19. The electronic device of claim 17, wherein the OLED turns on and the LCD turns off in response to the temperature sensed by the at least one sensor being below or at a predetermined low temperature threshold.

20. The electronic device of claim 19, either one of the OLED display or the LCD display is turned on as a default display when the temperature is above the predetermined low temperature threshold.

21. The electronic device of claim 20, wherein the default display is pre-programmed or selected by a user.

22. The electronic device of claim 19, wherein both the OLED display and the LCD are turned on when the temperature is above the predetermined low temperature threshold.

23. The electronic device of claim 14, wherein the second display comprises an electrophoretic display.

24. The electronic device of claim 23, wherein the OLED display turns on and the electrophoretic display turns off in response to light sensed by the at least one sensor being below a predetermined light threshold.

25. The electronic device of claim 24, either the OLED display or the electrophoretic display turns on as in response to the temperature sensed by the at least one sensor not being below the predetermined low temperature threshold.

26. The electronic device of claim 25, wherein turning on the OLED display or the electrophoretic display when the temperature is not below the predetermined low temperature threshold is either pre-programmed or selected by a user.

27. The electronic device of claim 24, wherein both the OLED display and electrophoretic display are turned on when the temperature is not below the predetermined low temperature threshold.

28. A method of forming a display, comprising;
layering a plurality of displays formed of different display technologies; and selectively controlling the plurality of displays based on an environmental input received from at least one temperature sensor.

29. The method of claim 28, wherein the plurality of displays comprises an OLED display and at least one other display of a different display technology.

30. The method of claim 29, further comprising:
controlling the layered displays based on environmental inputs that impact the viewability of the display technologies.

31. A display, comprising:
an overlay of an organic light-emitting diode (OLED) display and at least one other display formed of different display technology, wherein the OLED display and the at least one other display are selectively turned on and off based on input received from at least one temperature sensor.

32. The display of claim 31, wherein the OLED is located behind the at least one other display formed of different display technology.

33. The display of claim 31, wherein the at least one other display formed of different technology comprises a liquid crystal display (LCD), and the OLED display is located in front of the LCD.

34. The display of claim 33, wherein the LCD comprises a fast twisted-nematic (FSTN) LCD or twisted-nematic (TN) LCD display.

35. The display of claim 34, wherein the OLED display comprises a transparent OLED display.

36. The display of claim 33, wherein the LCD is a thin film transistor (TFT) LCD, and the OLED display is a transparent OLED display located in front of the TFT LCD.

37. The display of claim 31, wherein the at least one other display formed of the different display technology comprises an electrophoretic display.

38. The display of claim 37, wherein the OLED display comprises a transparent OLED located in front of the electrophoretic display.

* * * * *